(12) United States Patent
Wei et al.

(10) Patent No.: US 6,423,645 B1
(45) Date of Patent: Jul. 23, 2002

(54) METHOD FOR FORMING A SELF-ALIGNED CONTACT

(75) Inventors: Houng-chi Wei, Lo Tung Town; Tsong-lin Shen, Kao Hsiung, both of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/604,559

(22) Filed: Jun. 27, 2000

(30) Foreign Application Priority Data

Mar. 27, 2000 (TW) ......................................... 089105629

(51) Int. Cl.$^7$ ....................... H01L 21/302; H01L 21/461
(52) U.S. Cl. ......................................... 438/738; 438/970
(58) Field of Search ............................... 438/712, 717, 438/738, 740, 958, 970, 180, 229, 253, 254, 255, 260, 258, 239, 364, 396

(56) References Cited

U.S. PATENT DOCUMENTS

| | | | | |
|---|---|---|---|---|
| 4,860,076 A | * | 8/1989 | Tabei et al. ..................... | 357/30 |
| 5,766,342 A | * | 6/1998 | Shibuya et al. ................ | 117/54 |
| 5,883,006 A | * | 3/1999 | Iba .............................. | 438/712 |
| 6,033,952 A | * | 3/2000 | Yasummura et al. ........ | 438/717 |

* cited by examiner

Primary Examiner—David Nelms
Assistant Examiner—D Nhu
(74) Attorney, Agent, or Firm—Bacon & Thomas

(57) ABSTRACT

The present invention discloses a method for forming a self-aligned contact. In the present invention, a amorphous SiC layer or a HexaChloroDisilane-SiN (HCD-SiN) layer is formed on the surface of a transistor as an etching stopper layer. After removing part of the etching stopper layer, a gate protection film is formed on the surface of the gate electrode of a transistor. Due to the high etching selectivity of the gate protection film to the dielectric layer, the gate protection film effectively prevents the gate electrode of a transistor from being etched in the contact-etching process. In addition, the gate protection film has a low dielectric constant thereby reducing the parasitic capacitance of a bit line formed by the self-aligned contact forming method according to the present invention.

10 Claims, 5 Drawing Sheets

METHOD FOR FORMING A SELF-ALIGNED CONTACT

FIELD OF THE INVENTION

The present invention relates to a method for forming a self-aligned contact, and more particularly to a method for forming a self-aligned contact on a common source/drain region of transistors provided in a semicondutor substrate through high etching selectivity between a dielectric film and amorphous SiC, or high etching selectivity between a dielectric film and HexaChloroDisilane(HCD)-SiN.

BACKGROUND OF THE INVENTION

During the process of manufacturing a semiconductor memory on a semiconductor chip, it is necessary to form a bit line contact hole or capacitor contact hole for exposing a source or drain region of a transistor in the semiconductor memory. subsequently, the bit line contact hole or capacitor contact hole is filled with a metal or polysilicon film to form a bit line contact or capacitor contact.

FIGS. 1(a) to 1(b) are cross-sectional views showing a conventional method for forming a contact hole. As shown in FIG. 1(a), a first transistor 10 and a second transistor 20 are formed in a common semiconductor substrate 1 by a conventional method of forming a semiconductor transistor such as a metal-oxide-semiconductor transistor. A common source/drain region 3 is provided between a first gate electrode 2a of the first transistor 10 and a second gate electrode 2b of the second transistor 20. Next, as a dielectric layer for covering the first transistor 10 and the second transistor 20, a thick silicon oxide film 5 is deposited thereon. In order to define a contact hole region 6', a patterned photoresist film 7 is formed on the surface of the thick silicon oxide film 5 by the conventional process of photolithography. It should be noted that, in a horizontal direction, there must be a predetermined preventive distance 9 between the contact hole region 6' and each of the first gate electrode 2a and the second gate electrode 2b. These preventive distances 9 can prevent the first gate electrode 2a and the second gate electrode 2b from being etched to become short when the thick silicon oxide film 5 is etched.

Referring to FIG. 1(b), using the patterned photoresist film 7 as a mask, the thick silicon oxide film 5 is etched to form a contact hole 8' for exposing the common source/drain region 3 by a conventional process of anisotropic etching such as the process of reactive ion etching. After the formation of the contact hole 8', the above-mentioned bit line contact or capacitor contact is formed by filling the contact hole 8' with a conductive film (not shown).

As mentioned above, the predetermined preventive distance 9 is provided between the contact hole 8' and each of the first gate electrode 2a and the second gate electrode 2b so as to prevent the first gate electrode 2a and the second gate electrode 2b from being etched to become short when the thick silicon oxide film 5 is etched. However, as to advanced high density semiconductor memory devices such as dynamic random access memory (DRAM) devices in the order of megabyte, it is necessary to achieve a very high integration of memory cells. In the prior art, the increase of the integration of the semiconductor memory devices is greatly restricted since the space between the first gate electrode 2a and the gate electrode 2b is lengthened by the preventive distance 9. During recent years, a self-aligned contact without the preventive distance 9 has been developed to increase the integration of the semiconductor memory devices. In other words, a self-aligned contact hole is substantially aligned with the common source/drain region 3 of the first transistor 10 and the second transistor 20. Furthermore, the size of the self-aligned contact hole is substantially larger than or equal to that of the common source/drain region 3. A conventional method for forming the self-aligned contact is described in the following with reference to FIGS. 2 to 5.

As shown in FIG. 2, an etching stopper layer 4 is deposited on the first transistor 10 and the second transistor 20 provided with the common source/drain region 3. Next, referring to FIG. 3, the etching stopper layer 4 is partially removed by a conventional process of anisotropic etching such as the process of reactive ion etching so as to form a first gate protection film 4a covering the first gate electrode 2a and a second gate protection film 4b covering the second gate electrode 2b.

Referring to FIG. 4, a thick silicon oxide 5 is deposited on the first transistor 10 and the second transistor 20 to cover the first gate protection film 4a, the second gate protection film 4b, and the common source/drain region 3. In order to define a self-aligned contact region 6, a patterned photoresist film 7 is formed on the thick silicon oxide film 5 by a conventional process of photolithography. It should be noted that, unlike the structure shown in FIG. 1(a), there is no the above-mentioned preventive distance 9 between the self-aligned contact region 6 and each of the first gate electrode 4a and the second gate electrode 4b. As shown in FIG. 4, the size of the self-aligned contact region 6 is substantially larger than or equal to that of the common source/drain region 3. Furthermore, the self-aligned contact region 6 is substantially aligned with the common source/drain region 3.

Finally, referring to FIG. 5, using the patterned photoresist film 7 as a mask, the thick silicon oxide film 5 is etched to form a self-aligned contact hole 8 for exposing the common source/drain region 3 by a conventional process of anisotropic etching such as the process of reactive ion etching. After the formation of the self-aligned contact hole 8, the self-aligned bit line contact is formed by filling the self-aligned contact hole 8 with a conductive film (not shown).

In the above-mentioned method for forming a self-aligned contact, it is necessary to provide the first gate protection film 4a and the second gate protection film 4b for covering the first gate electrode 2a and the second gate electrode 2b, respectively. The reason is that the first gate protection film 4a and the second protection film 4b have a much slower etching rate than that of the thick silicon oxide film 5, so they prevent the first gate electrode 2a and the second gate electrode 2b from being etched, respectively, when the thick silicon oxide film 5 is etched. In the prior art, the first gate protection film 4a and the second gate protection film 4b are made of low pressure chemical vapor deposition-SiN (LPCVD-SiN) at a temperature of 450° C. or above. During the RIE process using a reactive chemical gas containing $C_4F_8$ and CO, the etching selectivity of LPCVD-SiN to silicon oxide is 20, that is, the ratio of the etching rate of the silicon oxide to LPCVD-SiN is 20:1. The LPCVD-SiN is suitable for the gate protection film due to a high etching selectivity of LPCVD-SiN to silicon oxide. However, the dielectric constant ($\in$) of LPCVD-SiN is approximately 7.8, and therefore results in a large parasitic capacitance of the bit line formed by the self-aligned contact. Accordingly, the performance of the semiconductor memory device with the conventional self-aligned contact is deteriorated.

SUMMARY OF THE INVENTION

It is therefore an object of the present invention to provide a method for forming a self-aligned contact by using a gate protection film with a high etching selectivity to silicon oxide, thereby effectively preventing a gate electrode from being etched.

It is another object of the present invention to provide a method for forming a self-aligned contact by using a gate protection film with a low dielectric constant, thereby reducing the parasitic capacitance of a bit line contact.

A method for forming a self-aligned contact according to the present invention comprises the following steps. At the beginning, a gate protection film is formed to cover a gate electrode of a transistor provided in a semiconductor substrate. Next, a dielectric layer is deposited on the gate protection film. Finally, the dielectric layer is selectively etched to form a contact hole for exposing the source/drain region of the transistor. In the present invention, the gate protection film is made of amorphous SiC or HexaChloroDisilane-SiN (HCD-SiN).

BRIEF DESCRIPTION OF THE DRAWINGS

The above and other objects, features, and advantages of the present invention will become more apparent from the following detailed description of embodiments take in conjunction with the accompanying drawings, wherein.

DETAILED DESCRIPTION OF THE PREFERRED EMBODIMENTS

The preferred embodiments according to the present invention will now be described in detail with reference to FIGS. 2 to 5.

First Embodiment

Figure 2:
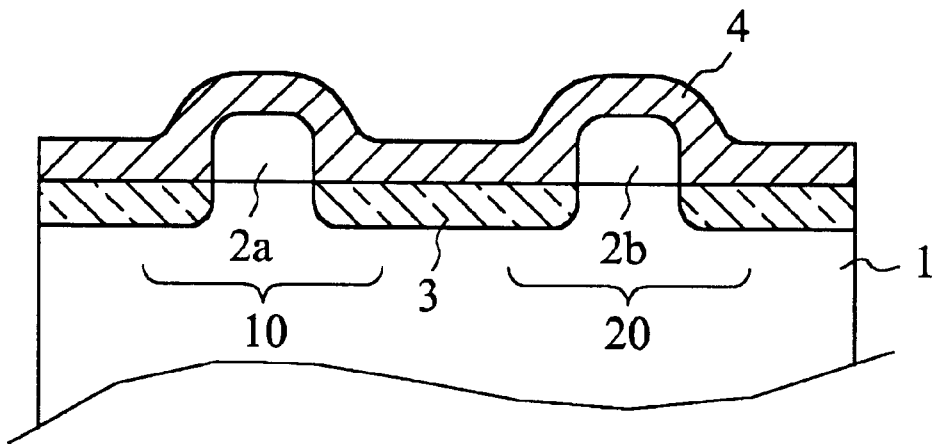
FIG. 2 is a cross-sectional view showing a etching stopper layer for covering transistors provided in a common semiconductor substrate.

FIGS. 2 to 5 are cross-sectional views showing a method for forming a self-aligned contact according to a first embodiment of the present invention. This self-aligned contact is adopted to connect with a common source/drain region of two transistors. As shown in FIG. 2, a first transistor 10 and a second transistor 20 are formed in a common semiconductor substrate 1 by a conventional method of forming a semiconductor transistor such as a metal-oxide-semiconductor transistor. A common source/drain region 3 is provided between a first gate electrode 2a of the first transistor 10 and a second gate electrode 2b of the second transistor 20. Next, an etching stopper layer 4 is deposited on the first transistor 10 and the second transistor 20.

Figure 3:
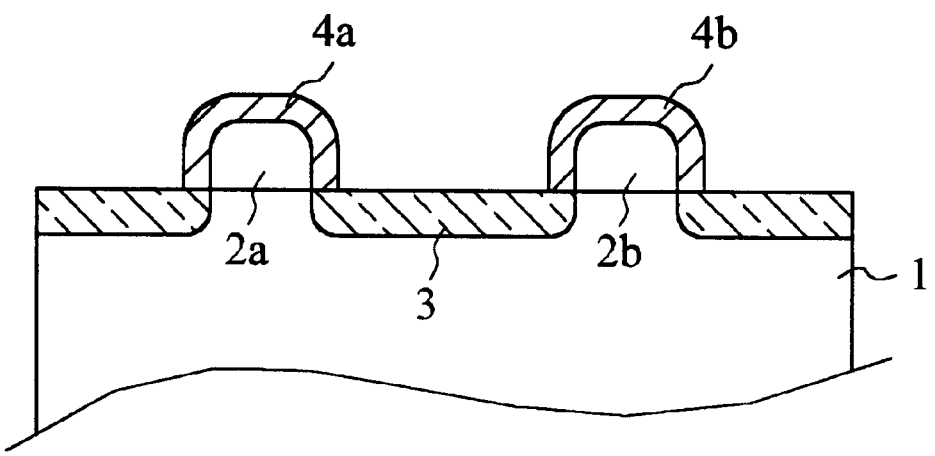
FIG. 3 is a cross-sectional view showing a first gate protection film and a second gate protection film for covering a first gate electrode and a second gate electrode, respectively.

Subsequently, the etching stopper layer 4 is partially removed by a conventional process of anisotropic etching such as the RIE process so as to form a first gate protection film 4a covering the first gate electrode 2a and a second gate protection film 4b covering the second gate electrode 2b, as shown in FIG. 3.

Figure 1A:
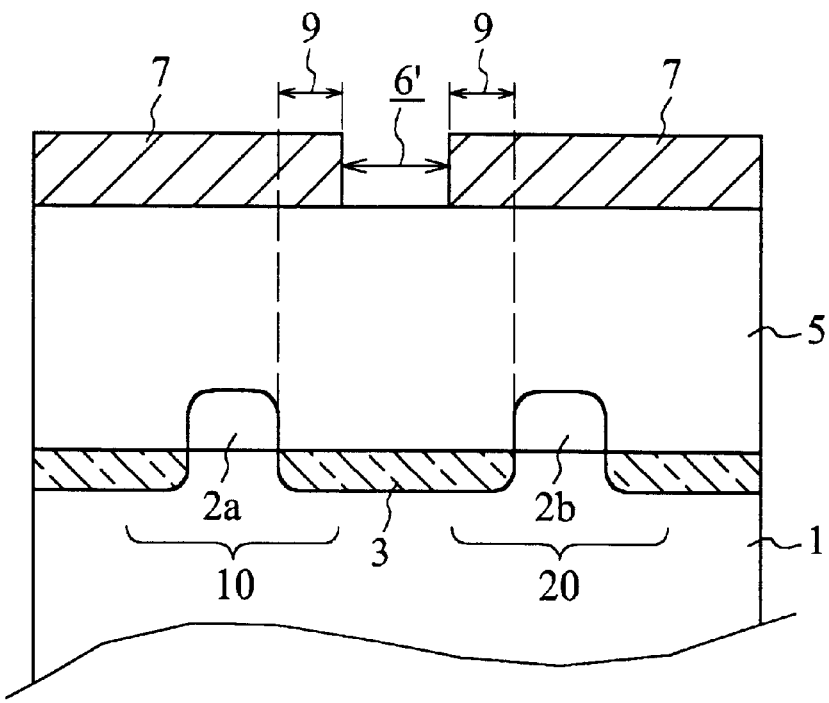
FIGS. 1(a) to 1(b) are cross-sectional views showing a method for forming a conventional contact hole.
Figure 1B:
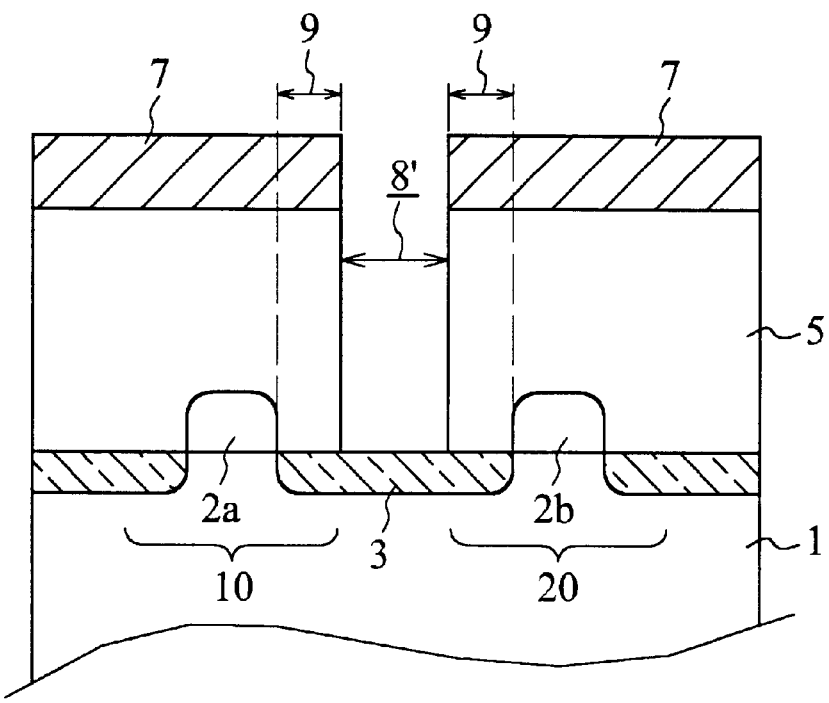
Figure 4:
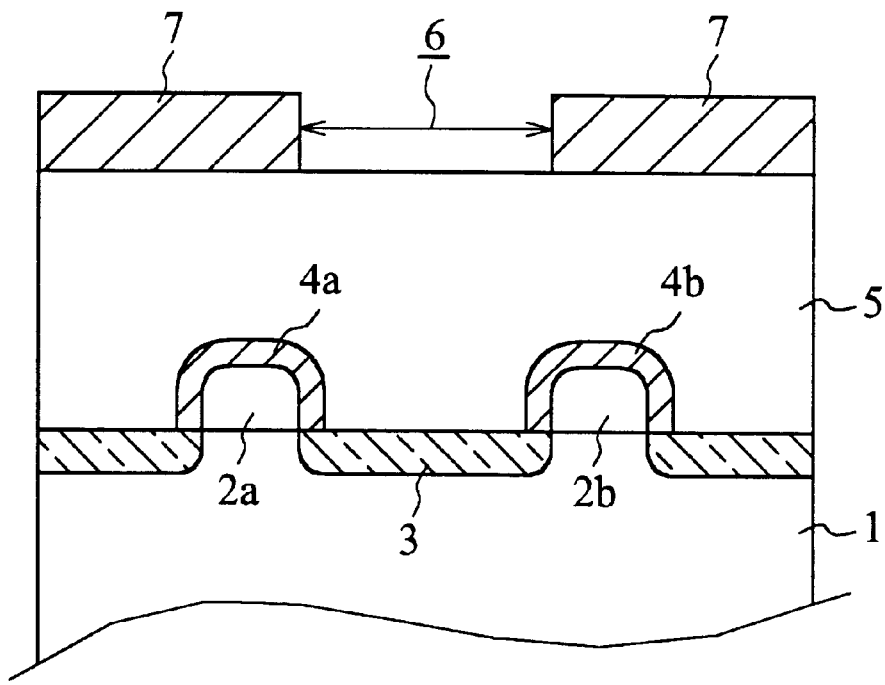
FIG. 4 is a cross-sectional view showing a patterned photoresist film and a dielectric layer deposited on the transistors.

Referring to FIG. 4, a thick silicon oxide 5 is deposited on the first transistor 10 and the second transistor 20 to cover the first gate protection film 4a, the second gate protection film 4b, and the common source/drain region 3. In order to define a self-aligned contact region 6, a patterned photoresist film 7 is formed on the thick silicon oxide film 5 by a conventional process of photolithography. It should be noted that, unlike the structure shown in FIG. 1(a), there is no the above-mentioned preventive distance 9 between the self-aligned contact region 6 and each of the first gate electrode 4a and the second gate electrode 4b. As shown in FIG. 4, the size of the self-aligned contact region 6 is substantially larger than or equal to that of the common source/drain region 3. Furthermore, the self-aligned contact region 6 is substantially aligned with the common source/drain region 3.

Figure 5:
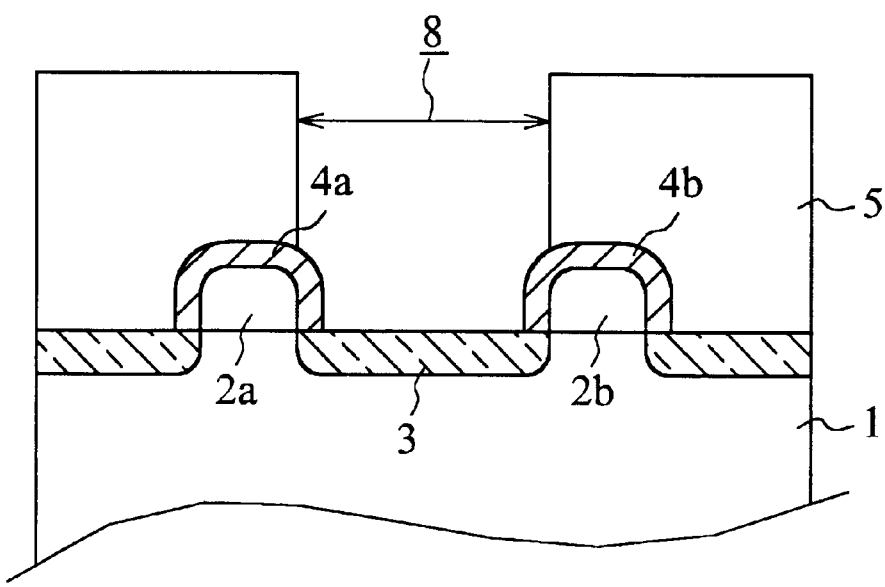
FIG. 5 is a cross-sectional view showing a self-aligned contact hole for exposing the common source/drain region of the transistors.
Figure 6:
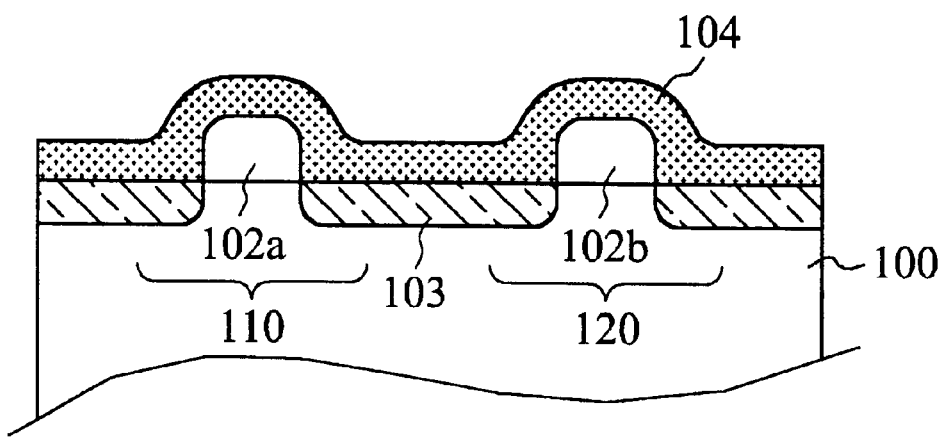
Figure 7:
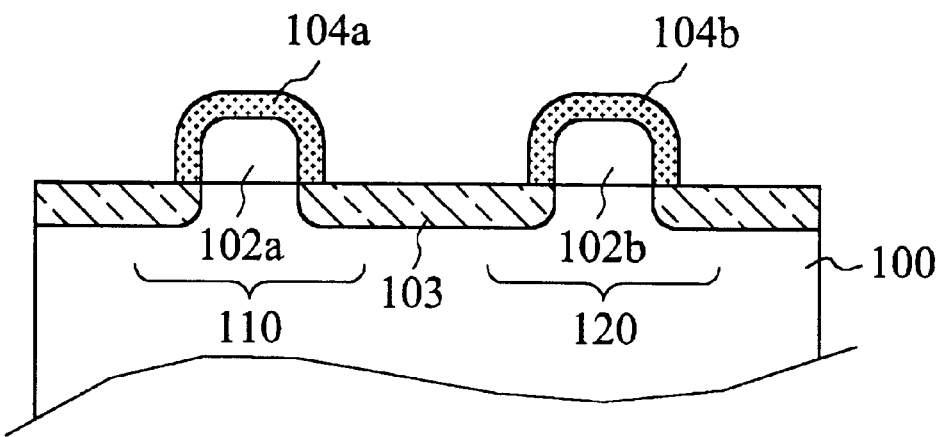
Figure 8:
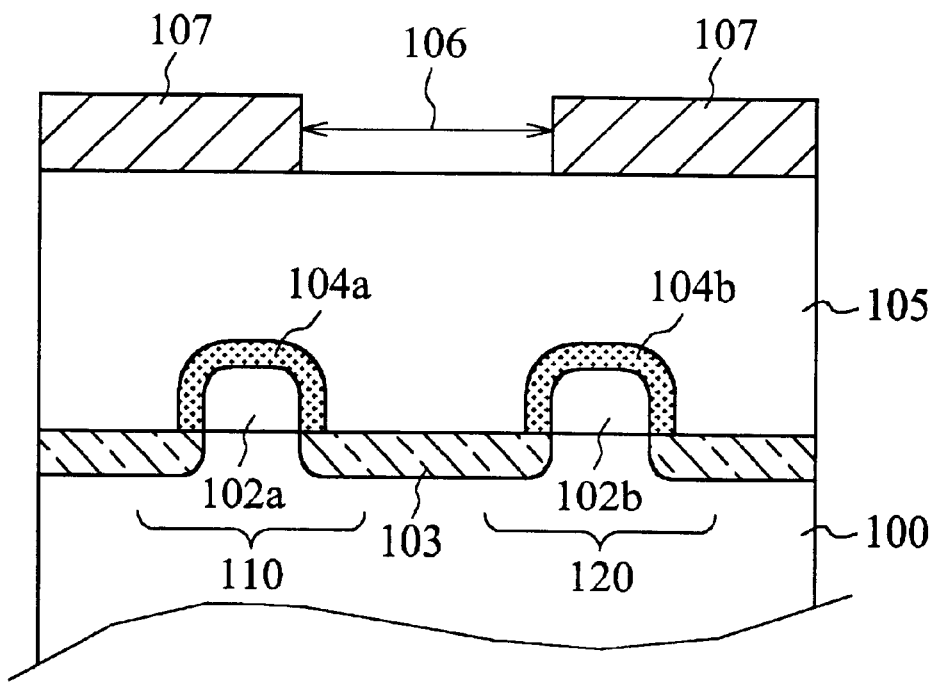
Figure 9:
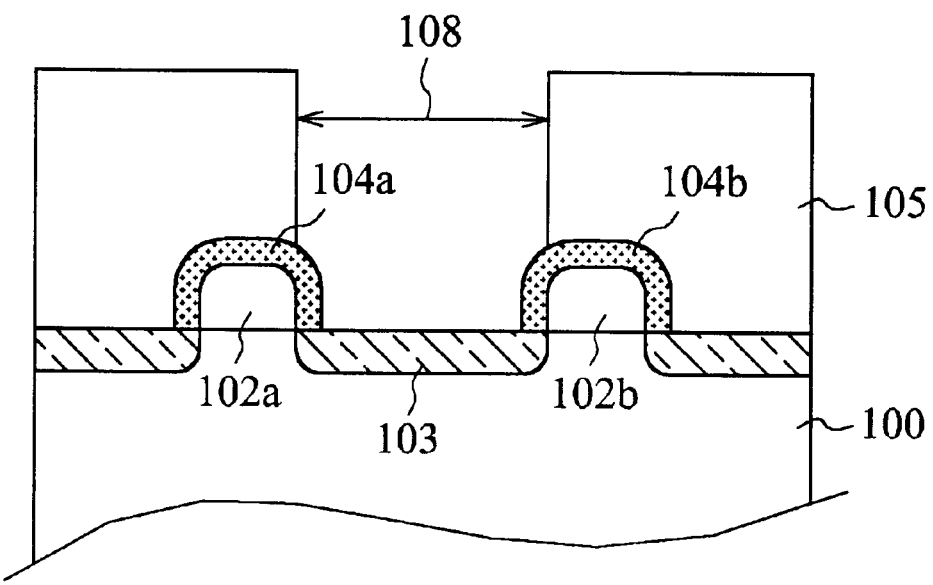

Finally, referring to FIG. 5, using the patterned photoresist film 7 as a mask, the thick silicon oxide film 5 is etched to form a self-aligned contact hole 8 for exposing the common source/drain region 3 by a conventional process of anisotropic etching such as the RIE process. After the formation of the self-aligned contact hole 8, the self-aligned bit line contact is formed by filling the self-aligned contact hole 8 with a conductive film (not shown).

In the first embodiment, amorphous SiC is used to form the etching stopper layer 4 shown in FIG. 2. The formation of the amorphous SiC etching stopper layer 4 is implemented by the process of chemical vapor deposition utilizing $Si(CH_3)_3H$ at a temperature of 250° C. to 500° C. As to amorphous SiC, the etching selectivity to silicon oxide is approximately 40 during the RIE process using a reactive chemical gas containing $C_4F_8$ and CO, and the dielectric constant ($\in$) is smaller than 5. Apparently, the etching selectivity of amorphous SiC to silicon oxide is higher than that of LPCVD-SiN to silicon oxide, and the dielectric constant ($\in$) of amorphous SiC is smaller than that of LPCVD-SiN. Therefore, the first gate protection film 4a and the second gate protection film 4b made of amorphous SiC effectively prevent the first gate electrode 2a and the second gate electrode 2b from being etched when the thick silicon oxide film 5 is etched, as shown in FIG. 5. Moreover, the parasitic capacitance of the bit line formed according to the first embodiment of the present invention is effectively reduced.

Second Embodiment

A second embodiment according to the present invention will now be described in detail with reference to FIGS. 2 to 5.

For the sake of simplification, only the step of forming the etching stopper layer 4 is described below because the other steps of the method for forming a self-aligned contact according to the second embodiment of the present invention are substantially the same as the corresponding steps of the first embodiment.

In the second embodiment, HexaChloroDisilane-SiN (HCD-SiN) is used to form the etching stopper layer 4 shown in FIG. 2. The formation of the HCD-SiN etching stopper layer 4 is implemented by the process of chemical vapor deposition utilizing HCD, $Si_2Cl_6$, and ammonia at a temperature of 200° C. to 450° C. As to HCD-SiN, the etching selectivity to silicon oxide is approximately 20 during the RIE process using a reactive chemical gas containing $C_4F_8$ and CO, and the dielectric constant ($\in$) is smaller than 5.4. Apparently, the etching selectivity of HCD-SiN to silicon oxide substantially equals that of LPCVD-SiN to silicon oxide, and the dielectric constant (∈) of HCD-SiN is smaller than that of LPCVD-SiN. Therefore, the first gate protection film 4a and the second gate protection film 4b made of HCD-SiN effectively prevent the first gate electrode 2a and the second gate electrode 2b from being etched when the thick silicon oxide film 5 is etched, as shown in FIG. 5, and the parasitic capacitance of bit line formed according to the second embodiment of the present invention is effectively reduced.

It should be noted that the above-mentioned preferred embodiments according to the present invention are applied to form the self-aligned contact for connecting to the common source/drain region of two transistors, but the method according to the present invention is not limited to these embodiments and also applicable for the formation of a self-aligned contact for connecting to a source or drain region of a single transistor.

Accordingly, the present invention provides a method for forming a self-aligned contact by using a gate protection film with a high etching selectivity to silicon oxide thereby effectively preventing a gate electrode from being etched. In addition, this gate protection film has a low dielectric constant thereby reducing the parasitic capacitance of the bit line.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method for forming a self-aligned contact, comprising the following steps:

forming a transistor on a semiconductor substrate;

depositing an etching stopper layer on the surface of said semiconductor substrate, therein, said etching stopper layer is covered on the surface of said transistor;

removing part of said etching stopper layer by an anisotropic etching process and forming a gate protection film on the surface of the gate electrode of said transistor; depositing a dielectric layer on the surface on said semiconductor substrate; and selectively etching the dielectric layer to form a contact hole for exposing the source/drain region of said transistor; therein, said etching stopper layer is formed of amorphous SiC or HexaChloroDisilane-SiN ($Si_2Cl_6$—SiN).

2. The self-aligned contact forming method according to claim 1, therein, said dielectric layer is formed of silicon oxide.

3. The self-aligned contact forming method according to claim 1, therein, the formation of said amorphous SiC etching stopper layer is implanted by the process of chemical vapor deposition utilizing $Si(CH_3)_3H$ at a temperature range of 250° C. to 500° C.

4. The self-aligned contact forming method according to claim 1, therein, the formation of said HexaChloroDisilane-SiN ($Si_2Cl_6$—SiN) etching stopper layer is implanted by the chemical vapor deposition utilizing HexaChloroDisilane ($Si_2Cl_6$) and ammonia, at a temperature range of 200° C. to 450° C.

5. The self-aligned contact forming method according to claim 1, therein, the size of said contact hole is large than or equal to the size of said source/drain region.

6. A method for forming a self-aligned contact, comprising the following steps:

forming a first transistor and a second transistor on a semiconductor substrate, therein, a common source/drain region is disposed between the gate electrodes of said first transistor and said second transistor;

depositing a etching stopper layer on the surface of said semiconductor substrate, therein, said etching stopper layer is covered on the surface of said first transistor and said second transistor;

removing part of said etching stopper layer by an anisotropic etching process and forming a first gate protection film and a second protection film, therein, said first gate protection film is covered on the surface of the gate electrode of said first transistor, and said second gate protection film is covered on the surface of the gate electrode of said second transistor;

depositing a dielectric layer on the surface of said semiconductor substrate; and selectively etching the dielectric layer to form a contact hole for exposing said common source/drain region of said first transistor and said second transistor; therein, said etching stopper layer is formed of amorphous SiC or HexaChloroDisilane-SiN ($Si_2Cl_6$—SiN).

7. The self-aligned contact forming method according to claim 6, therein, said dielectric layer is formed of silicon oxide.

8. The self-aligned contact forming method according to claim 6, therein, the formation of said amorphous SiC etching stopper layer is implanted by the process of chemical vapor deposition utilizing $Si(CH_3)_3H$ at a temperature range of 250° C. to 500° C.

9. The self-aligned contact forming method according to claim 6, therein, the formation of said HexaChloroDisilane-SiN ($Si_2Cl_6$—SiN) etching stopper layer is implanted by the chemical vapor deposition utilizing HexaChloroDisilane ($Si_2Cl_6$) and ammonia, at a temperature range of 200° C. to 450° C.

10. The self-aligned contact forming method according to claim 6, therein, the size of said contact hole is large than or equal to the size of said common source/drain region.

* * * * *